United States Patent [19]
Yoshimura

[11] Patent Number: 5,650,974
[45] Date of Patent: Jul. 22, 1997

[54] SEMICONDUCTOR MEMORY DEVICE AND POWER SUPPLY CONTROL IC FOR USE WITH SEMICONDUCTOR MEMORY DEVICE

[75] Inventor: Yoshimasa Yoshimura, Tokyo, Japan

[73] Assignee: Mitsubishi Denki Kabushiki Kaisha, Tokyo, Japan

[21] Appl. No.: 575,542

[22] Filed: Dec. 20, 1995

[30] Foreign Application Priority Data

Jan. 30, 1995 [JP] Japan .................. 7-013068

[51] Int. Cl.$^6$ .................................................. G11C 13/00
[52] U.S. Cl. .................................. 365/229; 365/228
[58] Field of Search ........................ 365/226, 227, 365/229, 228

[56] References Cited

U.S. PATENT DOCUMENTS

| 4,451,742 | 5/1984 | Aswell ........................... 365/229 |
| 5,375,246 | 12/1994 | Kimura et al. ................ 365/229 X |
| 5,502,682 | 3/1996 | Yoshimura ...................... 365/226 |

FOREIGN PATENT DOCUMENTS

| 60-238921 | 11/1985 | Japan ........................... 365/229 |
| 4-87533 | 3/1992 | Japan ........................... 365/229 |

Primary Examiner—Joseph A. Popek
Attorney, Agent, or Firm—Leydig, Voit & Mayer

[57] ABSTRACT

A semiconductor device includes a first battery BAT 1; a second battery BAT 2; and switches SW1, SW2, SW3, and SW4. Switching block 13 is provided for switching a power source for backing up a memory 3 to retain data. Also a voltage comparator 5 is provided for comparing an external power supply voltage supplied by the power supply VCC of a host apparatus with a reference voltage Vref. In response to the signal from a main battery presence sensor block for sensing the presence of the first battery BAT 1 and the signal from the voltage comparator 5, the memory 3 is backed up to retain data by the external power supply voltage when it is supplied, and further, the second battery BAT 2 is charged by a charging circuit 6 driven by the external power supply voltage. When neither external power supply voltage nor first battery BAT 1 is present, the second battery BAT 2 backs up the memory 3 to retain data. Therefore, power consumption of both main and auxiliary batteries is lessened and memory backup is performed in an assured manner.

10 Claims, 8 Drawing Sheets

SEMICONDUCTOR MEMORY DEVICE AND POWER SUPPLY CONTROL IC FOR USE WITH SEMICONDUCTOR MEMORY DEVICE

BACKGROUND OF THE INVENTION

1. Field of the Invention

This invention relates to a semiconductor memory device and a power supply control IC for use with a semiconductor memory device, and more particularly, to a portable-type semiconductor memory device backed up by a battery and the power control IC for use with a battery backed semiconductor memory device.

2. Description of the Related Art

FIG. 8 is a block diagram showing a known portable-type semiconductor memory device bearing a volatile semiconductor memory that needs battery backup. As shown in FIG. 8, the known portable-type semiconductor memory device 1 is connected to a host apparatus 2 via a connector, and is used as a data storage medium for the host apparatus 2. Typically available as an example of the portable-type semiconductor memory device 1 is a memory card that is a card-like data storage medium. As shown in FIG. 8, a memory 3 is provided for storing data and the like. The memory 3 is connected to the host apparatus 2 over a bus 7, through which data is exchanged, through the connector (not shown). The bus 7 is constructed of a data bus, an address bus, a control bus and the like, and over these buses, the host apparatus 2 sends a variety of data DATA, address data ADD, and a control signal CS and the like to the memory 3, and data stored in the memory 3 are accessed. Since the memory 3 is constructed of a volatile semiconductor memory such as an SRAM, power must be always supplied to it to hold data (for data backup). During use, the power supply VCC of the host apparatus 2 feeds, via a power supply line 100, power that is internally consumed by the portable-type semiconductor memory device 1 including the memory 3. When the portable-type semiconductor memory device 1 is disconnected from the host apparatus 2, power from the power supply VCC of the host apparatus 2 is interrupted. To prepare for power interruption, the portable-type semiconductor memory device 1 has, as internal power supplies, a first battery BAT 1 as its main battery and a second battery BAT 2 as its auxiliary battery.

Shown in FIG. 8 are: an external power supply voltage node 101 serving as a host apparatus power supply voltage node connected via the connector to the power supply line 100; an internal power supply voltage node 8 for supplying internally power to the internal circuit of the portable-type semiconductor memory device 1 including the memory 3; a main battery power supply voltage node 102 for receiving main battery power from the first battery BAT 1; an auxiliary battery power supply voltage node 103 for receiving auxiliary battery power from the second battery BAT 2; and a connection node 104 to which the output node of a voltage comparator 5 to be described later is connected.

The external power supply voltage node 101 is connected to the internal power supply voltage node 8 via a switch SW1 to be described later. The main battery power supply voltage node 102 and auxiliary battery power supply node 103 are arranged in parallel between the connection node 106 and ground node. The connection node 106 is connected to the internal power supply voltage node 8 via a switch SW2 to be described later. The memory 3 is powered via the internal power supply voltage node 8 from the power supply VCC in the host apparatus 2 as the external power supply or from the internal power supply, namely the first battery BAT 1 and the second battery BAT 2, thereby the memory 3 holds data. The first battery BAT 1 comprises a non-rechargeable primary battery such as a button battery, and the second battery BAT 2 comprises a rechargeable secondary battery. As shown in FIG. 8, R3 is connected between the connection node 106 and the switch SW2 and works as a protective resistor for controlling reverse current and is used commonly for both the first battery BAT 1 and second battery BAT 2. A protective diode D1 is connected between the connection node 106 and the main battery power supply voltage node 102 for preventing reverse current.

When a rechargeable secondary battery is used as the main battery or auxiliary battery, no battery replacement is required. A secondary battery, however, ages in performance through repeated charge and recharge cycles, prolonged storage periods, and environmental factors (high temperatures, temperature cycles, and the like), and is problematic in terms of reliability. Therefore, using the secondary battery as the main battery is not recommended. In view of this, a primary battery needing replacement is typically used as the main battery BAT 1. The second battery BAT 2 is provided to back up the memory 3 for data holding during replacement of the first battery BAT 1. Since the second battery BAT 2 is consumed during a brief period of time only for the replacement of the first battery BAT 1, the second battery BAT 2 may be a small-capacity battery and further may be a rechargeable secondary battery that needs no replacement. In the known semiconductor memory device 1 depicted in FIG. 8, the first battery BAT 1 serves also as a charging power supply for the second battery BAT 2.

Since the first battery BAT 1 is supposed to be replaced, the known portable-type semiconductor memory device 1 is provided with a detachable battery holder (not shown). Although the second battery BAT 2 theoretically needs no replacement, the known portable-type semiconductor memory device 1 employs a chemical battery, that in practice has limited charge and discharge cycles. The chemical battery is typically limited to hundreds of charge and discharge cycles. Furthermore, as already described, the battery ages in performance under operating and environmental conditions and sometimes battery liquid leakage occurs. In view of the above, the known portable-type semiconductor memory device 1 is also provided with the battery holder (not shown) for the second battery BAT 2 so that the second battery BAT 2 may be also replaced.

As already described, two switches SW1 and SW2 are provided to switch between the power supply VCC in the host apparatus 2 as the external power supply and the internal power supply of the first battery BAT 1 and second battery BAT 2. When the switch SW1 is on, the power supply VCC in the host apparatus 2 feeds power to the memory 3 via the internal power supply voltage node 8, and when the switch SW2 is on, the first battery BAT 1 and second battery BAT 2 feed power to the internal power supply voltage node 8. Also provided are a reference voltage generator circuit 4 for generating a reference voltage Vref, and resistors and R2 which are connected in series between the external power supply voltage node 101 and the ground node for giving at a connection node 105 of the resistors R1 and R2 a voltage responsive to the supply voltage supplied at the external power supply voltage node 101. A voltage comparator 5 which is driven by the supply voltage supplied at the external power supply voltage node 101 via the power supply line 100 by the host apparatus 2 is also provided as shown in FIG. 8. The voltage comparator 5 has one input node connected to the connection node 105 and the other input node for receiving the reference voltage Vref from the reference voltage generator circuit 4. The voltage comparator 5 outputs a signal VCOM that instructs to use the external power supply voltage when the voltage appearing at the node 105 is higher than the reference voltage Vref, and instructs to use the internal power supply voltage when the voltage appearing at the node 105 is lower than the reference voltage Vref. In response to the signal VCOM from the voltage comparator 5, the switches SW1 and SW2 are controlled for switching. Both switches SW1 and SW2 herein are constructed of a p-channel type switch such as a p-channel MOS transistor.

The output node of the voltage comparator 5 is connected to the connection node 104. The connection node 104 is connected to the gate of the switch SW1 and is also connected to the gate of the switch SW2 via a NOT gate circuit 9. When the voltage comparator 5 outputs an H-level (high level) VCOM signal, the signal is given to the switch SW1, causing it to turn off. At the same time, the switch SW2 receives the inverted signal of VCOM via the NOT gate circuit 9, and then is turned on. On the other hand, when the voltage comparator 5 outputs an L-level (low level) VCOM signal, the switch SW1 is turned on and the switch SW2 is turned off. Namely, when the voltage appearing at the connection node 105 is lower than the reference voltage Vref, the voltage comparator 5 outputs the H-level VCOM signal, causing the switch SW1 to turn off and the switch SW2 to turn on, and the battery power supply voltage supplied at the main battery power supply voltage node 102 connected to the first battery BAT 1 (or at the auxiliary battery power supply voltage node 103 connected to the second battery BAT 2 when the first battery BAT 1 is not present) is fed to the internal power supply voltage node 8. When the voltage appearing at the connection node 105 is higher than the reference voltage Vref, the voltage comparator 5 outputs the L-level VCOM signal causing the switch SW1 to turn on and the switch SW2 to turn off at the same time, and the external power supply voltage supplied at the external power supply voltage node 101 is fed to the internal power supply voltage node 8.

FIG. 9 shows the construction of another known portable-type semiconductor memory device 1A. Since in the known semiconductor memory device 1 in FIG. 8 the first battery BAT 1 works as the charging power supply for the second battery BAT 2 that is the auxiliary battery, the consumption of the first battery BAT 1 is disadvantageously expedited. In this known example, therefore, the second battery BAT 2 as the auxiliary battery is charged by a charging circuit 6 to be described later which is driven by the external power supply voltage supplied via the external power supply voltage node 101 connected to the power supply VCC in the host apparatus 2 as the external power supply. In this example, the second battery BAT 2 is connected, via a switch SW4, to the charging circuit 6 driven by the power supply VCC in the host apparatus 2. When the external power supply voltage supplied at the external power supply voltage node 1 by the power supply VCC is higher than a predetermined value, the charging circuit 6 charges the second battery BAT 2 with the external power supply supplied via the external power supply voltage node 101.

As FIG. 10 shows an example, the charging circuit 6 comprises: an npn transistor 6e with its collector connected to the external power supply voltage node 101, its base connected to a connection node 62, and its emitter connected to an output node 61; a resistor 6a connected between the output node 61 and a connection node 63; a resistor 6b connected between the connection node 63 and ground node; a constant current source 6f connected between the external power supply voltage node 101 and the connection node 62 to which the base of the npn transistor 6e is connected; an npn transistor 6d with its collector connected to the connection node 62 and its base connected to the connection node 63; and a resistor 6c connected between the emitter of the npn transistor 6d and the ground node. The operation of the charging circuit 6 is now discussed. The constant current source 6f presents a constant voltage VBE between the base and emitter of the npn transistor 6d. When a resistance value of the resistor 6c is set so that a value of the voltage drop across the resistor 6c is equal to a value of the voltage VBE, the resistor 6c offers a zero temperature coefficient. Therefore, the voltage appearing at the connection node 63 is a constant voltage that is less temperature-dependent. By magnifying this through resistors 6a and 6b, a constant voltage of 3 V to be used as battery charging voltage appears at the connection node 61. Since the second battery BAT 2 is provided with the charging circuit 6, the main battery power supply voltage node 102 and the auxiliary battery power supply voltage node 103 are connected to the internal power supply voltage node 8 via separate switches SW2 and SW3, respectively. The rest of the construction remains unchanged from that in FIG. 8, and those component equivalent to those with reference to FIG. 8 are designated with the same reference numerals and their explanation will not be repeated.

In this known example, the gates of the switches SW2 and SW3 are connected, through the NOT gate circuit 9, to the connection node 112 that is connected to the output node of the voltage comparator 5. When the voltage comparator 5 outputs a VCOM signal, an inverted VCOM signal is input to the switches SW2 and SW3. On the other hand, the gates of switches SW1 and SW4 are directly connected to the connection node 112 that connects to the output node of the voltage comparator 5, and thus, the VCOM signal is fed to them, as it is. Since these switches SW1, SW2, SW3 and SW4 are all constructed of p-channel MOS transistors, the switches SW1 and SW4 are turned off with the switches SW2 and SW3 turned on when the voltage comparator 5 outputs the H-level VCOM signal. When the voltage comparator 5 outputs the L-level VCOM signal, the switches SW1 and SW4 are turned on with the switches SW2 and SW3 turned off. The voltage comparator 5 herein outputs the L-level VCOM signal when the voltage at the connection node 105 given by the resistors R1 and R2, that voltage divide the external power supply voltage supplied at the external power supply voltage node 101, is higher than the reference voltage Vref. On the other hand, the voltage comparator 5 outputs the H-level VCOM signal when the voltage at the connection node 105 is lower than the reference voltage Vref.

In the known example as shown in FIG. 9, when the portable-type semiconductor memory device 1A is connected to the host apparatus 2, namely when the voltage appearing at the connection node 105 is higher than the reference voltage Vref, the switch SW1 is turned on. The power supply VCC feeds the voltage to the internal power supply voltage node 8 so that data stored in the memory 3 is held. At the same time, the switch SW4 is turned on, causing the second battery BAT 2 to be charged by the charging circuit 6 driven by the power supply VCC. On the other hand, when the power from the power supply VCC is interrupted when the portable-type semiconductor memory device 1A is disconnected from its host apparatus 2, namely when the voltage appearing at the connection node 105 is lower than the reference voltage Vref, the voltage comparator 5 gives the output signal VCOM that causes the switches SW1 and SW4 to turn off and the switches SW2 and SW3 to turn on. The first and second batteries BAT 1 and BAT 2 feed the power to the internal power supply voltage node 8 for the memory 8 to hold data, via the main battery power supply voltage node 102 and the auxiliary battery power supply node 103, respectively.

As has been described above, in the known example in FIG. 8, the first battery BAT 1 which serves as the main battery works as the charging power supply for the second battery BAT 2 serving as the auxiliary battery BAT 2. In such an arrangement, the first battery BAT 1 is consumed rapidly, thereby shortening the life of the first battery BAT 1 and leading to premature replacement.

In the known example in FIG. 9, since the second battery BAT 2 is charged by the charging circuit 6 driven by the power supply VCC in the host apparatus 2, such an inconvenience as rapid consumption of the first battery BAT 1 experienced in the example in FIG. 8 will not take place. When the portable-type semiconductor memory device 1A as shown in FIG. 9 is disconnected from the host apparatus 2, power of both the first battery BAT 1 and the second battery BAT 2 is consumed at the same rate for the memory 3 to hold data. The second battery BAT 2 may be already fully consumed when it is needed most, namely during the replacement of the first battery BAT 1. Data holding by the memory 3 thus may not be properly performed and the loss of data may take place.

In the known device in FIG. 9, therefore, the second battery BAT 2 should be of a relatively large capacity, and thus a small battery cannot be used. As a result, the unit becomes bulky. Since in both known devices 1 and 1A in FIGS. 8 and 9, a chemical battery is employed as the second battery BAT 2, the second battery BAT 2 has its limitation in charge and discharge cycles and is subject to aging and liquid leakage problems. In view of these, a battery holder is included to assure the replacement of the battery. This makes the device even bulkier, and complicates manufacturing steps, and increases manufacturing costs.

SUMMARY OF THE INVENTION

In view of the above problems, the present invention has been developed, and it is an object of the present invention to provide a portable-type semiconductor memory device and a semiconductor integrated circuit for use in the portable-type semiconductor memory device, wherein said device consumes a minimum amount of power from its main battery as well as from its auxiliary battery, holds data in a memory that is powered by the battery power supply in the form of the main battery or the auxiliary battery when power from a host apparatus is cut off, in an assured manner so that data loss is prevented, implements compact design and is produced in easy manufacturing steps and at an economical manufacturing cost.

According to the present invention, a semiconductor memory device comprises: an external power supply voltage node to which an external power supply voltage is supplied; an internal power supply voltage node for transmitting an internal power supply voltage; a volatile semiconductor memory backed up for holding data by the internal power supply voltage; a first battery having a capacity for backing up the memory for data holding for a long period of time; a second battery for backing up the memory for holding data during a replacement of the first battery; charging means driven by the external power supply voltage for charging the second battery; a first battery voltage node to which a first battery power supply voltage is supplied by the first battery; a second battery voltage node to which a second battery power supply voltage is supplied by the second battery; external power supply voltage detector means for detecting the external power supply voltage at the external power supply voltage node; first battery presence sensor means for sensing a presence/absence of the first battery; and switching means operating based on a signal from the external power supply voltage detector means and a signal from the first battery presence sensor means; (a) when the external power supply voltage supplied at the external power supply voltage node is higher than a predetermined value, the switching means connects the external power supply voltage node to the internal power supply voltage node while connecting also the charging means to the second battery; and (b) when the external power supply voltage supplied at the external power supply voltage node is lower than the predetermined value; (b1) if the first battery is present, the switching means connects the first battery voltage node to the internal power supply voltage node; (b2) if the first battery is not present, the switching means connects the second battery voltage node to the internal power supply voltage node.

Also, the switching means may comprise: a first switching portion for connecting between the external power supply voltage node and the internal power supply voltage node according to the signal from the external power supply voltage detector means when the external power supply voltage supplied at the external power supply node is higher than the predetermined value; a second switching portion for connecting between the first battery voltage node and the internal power supply voltage node according to the signal from the external power supply voltage detector means when the external power supply voltage supplied at the external power supply node is lower than the predetermined value; a third switching portion for connecting between the second battery voltage node and the internal power supply voltage node according to the signal from the external power supply voltage detector means when the external power supply voltage supplied at the external power supply node is lower than the predetermined value; a fourth switching portion for connecting between the charging means and the second battery according to the signal from the external power supply voltage detector means when the external power supply voltage supplied at the external power supply voltage node is higher than the predetermined value; and a switching block for disconnecting between the second battery voltage node and the third switching portion, and simultaneously disconnecting between the second battery voltage node and the fourth switching portion, according to the signal from the external power supply voltage detector means and the signal from the first battery presence sensor means, when the external power supply voltage at the external power supply voltage node is lower than the predetermined value with the first battery being present.

The present invention also resides in a power control IC for use in the semiconductor memory device which is constructed of a single chip IC and comprises charging means, external power supply voltage detector means, and switching means.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENT

Embodiment 1

Figure 1:
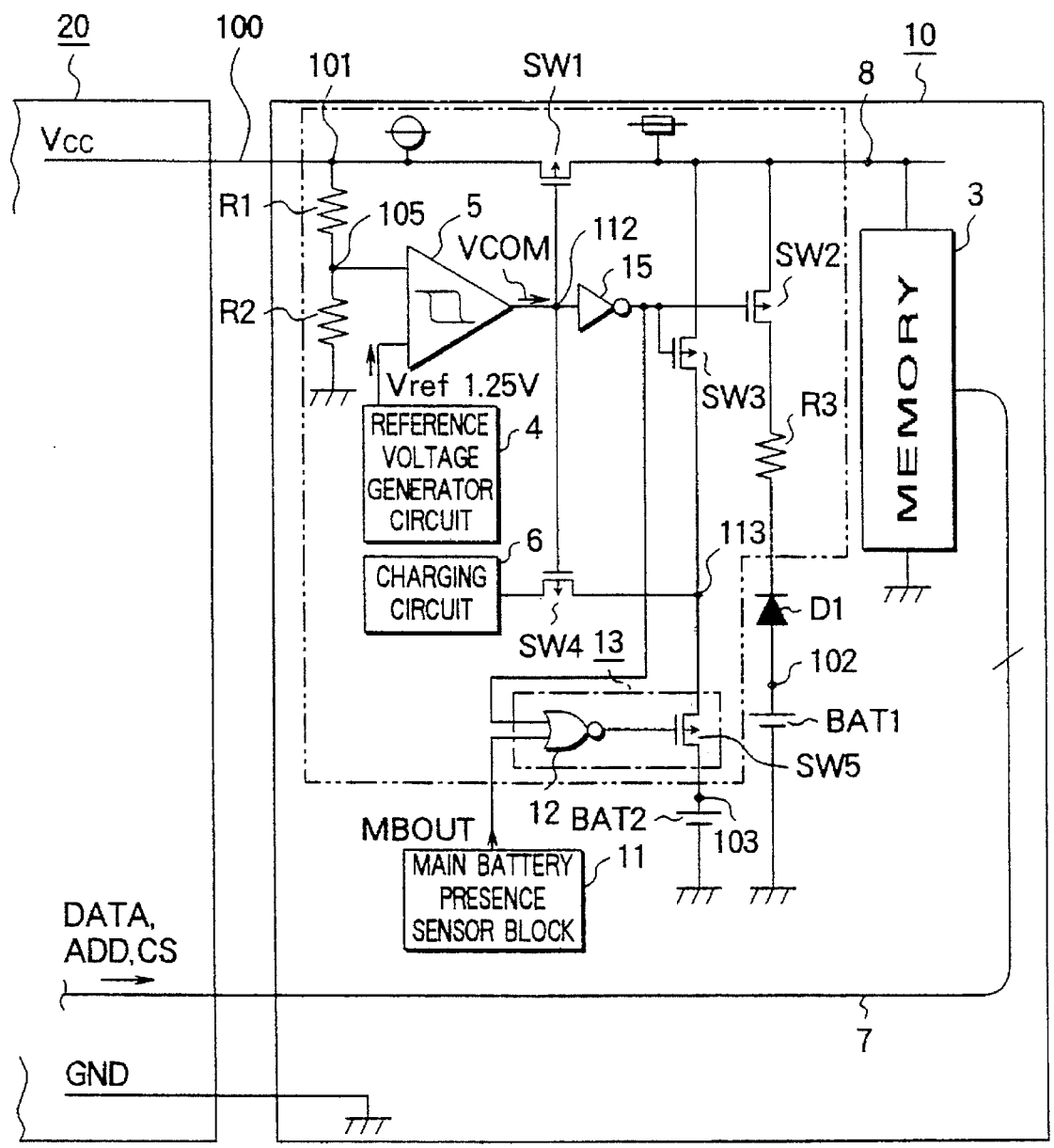
FIG. 1 is a block diagram showing the construction of the portable-type semiconductor memory device according to embodiment 1 of the present invention.

FIG. 1 is the block diagram showing the construction of the portable-type semiconductor memory device of the present invention. As shown in FIG. 1, the portable-type semiconductor memory device 10 of the present invention is connected to a host apparatus 20 and is used as a data storage medium for the host apparatus 20. While connected to the host apparatus 20, the portable-type semiconductor memory device 10 of the present invention is powered by the power supply of the host apparatus 20 as an external power supply, with external power supply voltage fed to an internal power supply voltage node 8 through which internal power supply voltage to be consumed in the semiconductor memory device 10 is supplied. A switch SW1 as a first switching portion is connected between the internal power supply voltage node 8 and an external power supply voltage node 101 to which the power supply of the host apparatus 20 feeds the external power supply voltage. As in the known device in FIG. 9, the gate of the switch SW1 is connected to the output node of a voltage comparator 5. The switch SW1 will be described in detail later. The portable-type semiconductor memory device 10 is provided with a memory 3 constructed of a volatile semiconductor memory such as an SRAM for storing data and the like. To hold data in the memory 3 during the interruption of power from the power supply VCC of the host apparatus 20, a first battery BAT 1 as the main battery and a second battery BAT 2 as the auxiliary battery are connected to the internal power supply voltage node 8 via switches SW2 and SW3, respectively. The switch SW 2 constitutes the second switching portion, and is connected between the internal power supply voltage node 8 and the main battery power supply voltage node 102 serving as the first battery voltage node which is connected to the first battery BAT 1. The gate of the switch SW2 is connected via a NOT gate circuit 15 to a connection node 112 that connects to the output node of the voltage comparator 5 to be described later. The switch SW3 constitutes the third switching portion, and is connected between the internal power supply voltage node 8 and the auxiliary battery power supply voltage node 103 serving as the second battery voltage node connected to the second battery BAT 2. The gate of the switch SW3 is connected via the NOT gate circuit 15 to a connection node 112 that connects to the output node of the voltage comparator 5. Both the switches SW2 and SW3 are constructed of p-channel MOS transistors. When the voltage comparator 5 outputs the L-level VCOM signal, an inverted signal of VCOM goes to both the switches SW2 and SW3, so that both of the switches SW2 and SW3 are turned off. When the voltage comparator 5 outputs the H-level VCOM signal, both of the switches SW2 and SW3 are turned on.

As in the known device, this embodiment comprises two resistors R1 and R2 which are connected in series between the external power supply voltage node 101 and the ground node for giving at a connection node 105 of the resistors R1 and R2 a voltage responsive to the supply voltage supplied at the external power supply voltage node 101. Also, a reference voltage generator circuit 4 is provided for generation s reference voltage Vref. The voltage comparator 5 which has one input node for receiving the voltage responsive to the external power supply voltage at the external power supply voltage node 101, namely the voltage appearing at the connection node 105 which is made up by dividing by means of the resistors R1 and R2, and the other input node for receiving the reference voltage Vref from the reference voltage generator circuit 4, in order to compare both input voltages, and output the L-level VCOM signal when the voltage appearing at the node 105 is higher than the reference voltage Vref and output the H-level VCOM signal when the voltage appearing at the node 105 is lower than the reference voltage Vref. The resistors R1 and R2, the reference voltage generator circuit 4 and the voltage comparator 5 constitute the external power supply voltage detector means for detecting the external power supply voltage at the external power supply voltage node 101. Hysteresis is imparted to the voltage comparator 5 and the turn-off of the switch SW1 (or switches SW2 and SW3) is designed to take place slightly later in time than the turn-on of the switches SW2 and SW3 (or switch SW1), so that power input to the memory 3 may not be interrupted.

The first battery BAT 1 herein is of a primary battery such as a large capacity button battery capable of backing up the memory 3 for data holding (data backup) for a long period of time. The second battery BAT 2 is of a rechargeable secondary battery, and supplies a voltage to the internal power supply voltage node 8 so that the memory 3 holds data for a brief period of time during which the first battery BAT 1 as the main battery is replaced. Connected between the main battery power supply voltage node 102 and the switch SW2 are a protective resistor R3 for controlling reverse current on the first battery BAT 1 and a protective diode D1 for preventing the reverse current. Since the first battery BAT 1 is of the primary battery that cannot be recharged, a detachable battery holder (not shown) is provided to facilitate battery replacement. As for the structure of the holder, the one shown in FIG. 5 but without the mechanical switch SW6 is acceptable. The battery holder in FIG. 5 will be discussed later in detail in a description referring to the fourth embodiment.

The switch SW1 is connected between the external power supply voltage node 101 and the internal power supply node 8, and the gate of the switch SW1 is connected to the connection node 112 that connects to the output node of the voltage comparator 5. A switch SW4 constitutes the fourth switching portion, and is connected between the output node of a charging circuit 6 as the charging means driven by the external power supply voltage provided by the power supply VCC of the host apparatus 20 and a connection node 113 that is connected to an auxiliary battery power supply voltage node 103 via a switch SW5 to be described later. The gate of the switch SW4 is connected to the connection node 112 that connects to the output node of the voltage comparator 5. Both of the switches SW1 and SW4 are of a p-channel MOS transistor, and are turned off when the voltage comparator 5 outputs the H-level VCOM signal, and turns on when the voltage comparator 5 outputs the L-level VCOM signal. Namely, in response to the VCOM signal from the voltage comparator 5, the switches SW1 and SW4 operate in a manner opposite to the manner in which switches SW2 and SW3 operate.

When the switch SW1 is turned on, the power supply VCC of the host apparatus 20 supplies, to the internal power supply voltage node 8, power that is consumed by the internal electronics of the portable-type semiconductor memory device 10 including the memory 3. While the switch SW1 remains turned on, the switch SW4 is turned on as well, and the second battery BAT 2 is charged by the charging circuit 6 driven by the power supply VCC of the host apparatus 20. Meanwhile, the switches SW2 and SW3 are turned off. Conversely, when the switches SW2 and SW3 are turned on with the switches SW1 and SW4 off, the first battery BAT 1 supplies through the main battery power supply voltage node 102 to the internal power supply voltage node 8, power that is consumed by the internal electronics of the portable-type semiconductor memory device 10 including the memory 3. (When the first battery BAT 1 is not present, the second battery BAT 2 supplies power through the auxiliary battery power supply voltage node 103 to the internal power supply voltage node 8. Refer to the next paragraph for detail).

Figure 9:
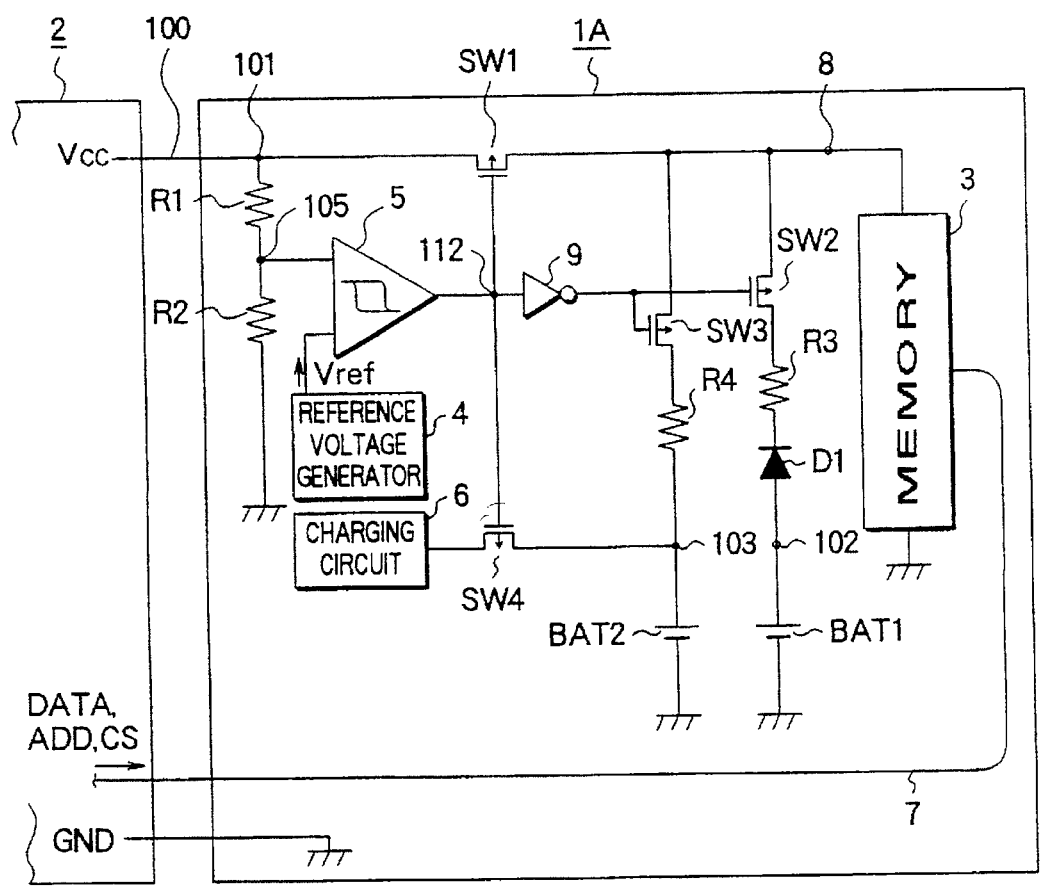
FIG. 9 is the block diagram showing the construction of another privately known portable-type semiconductor memory device.
Figure 10:
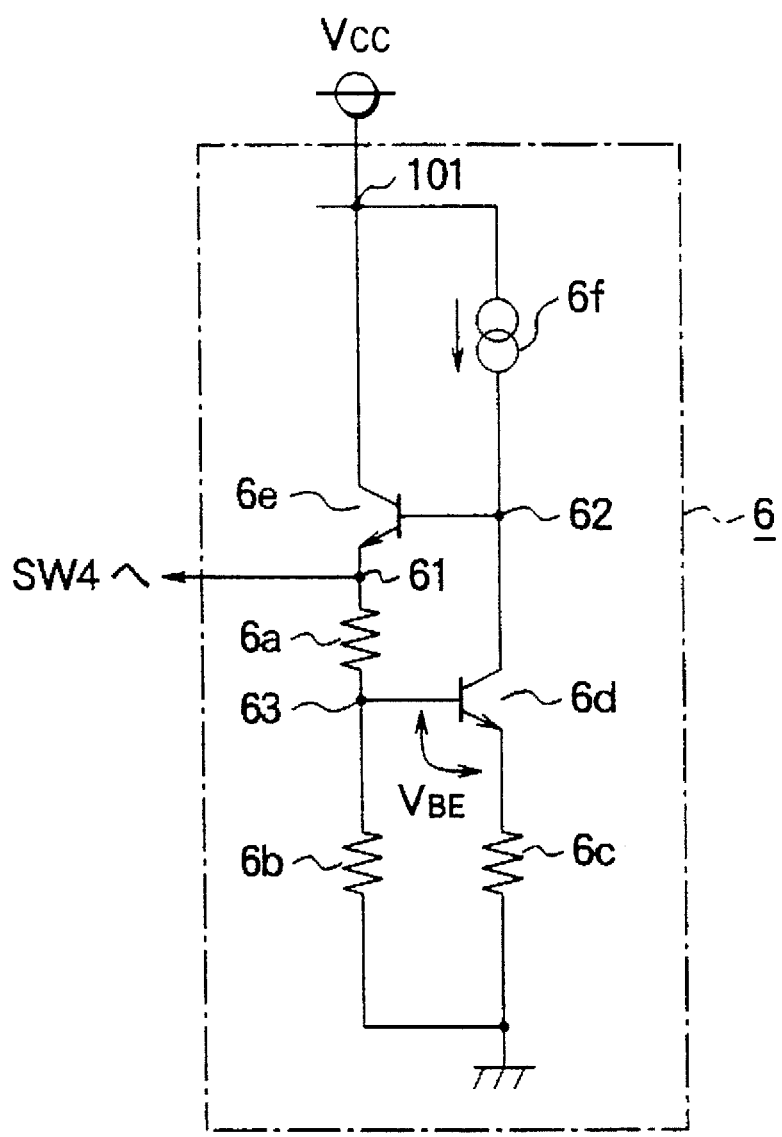
FIG. 10 is the block diagram showing the construction of the charging circuit of FIG. 9.

Until now, the description of the construction of this embodiment remains unchanged from that of the known device in FIG. 9. In the portable-type semiconductor memory device 10 in this embodiment, the second battery BAT 2 supplies via its associated auxiliary battery power supply voltage node 103 to the internal power supply voltage node 8, power that is consumed by the internal electronics in the portable-type semiconductor memory device 10 including the memory 3, only when both of the switches SW2 and SW3 are turned on with the switches SW1 and SW4 turned off and when the first battery BAT 1 is not present. The discussion of this arrangement follows. This embodiment includes a main battery presence sensor block 11 serving as the first battery presence sensor means which senses the presence of the first battery BAT 1 as the main battery so as to output an L-level main battery presence signal MBOUT when the first battery BAT 1 is present, and output an H-level main battery presence signal MBOUT when the first battery BAT 1 is pulled out for replacement. Refer to embodiments 2 through 4 for the construction of the main battery presence sensor block 11.

This embodiment further includes a switching block 13. Receiving the MBOUT signal from the main battery presence sensor block 11 and the inverted signal of VCOM outputted from the voltage comparator 5, the switching block 13 switches connection/disconnection between the auxiliary battery power supply voltage node 103 and the connection node 113, and thereby, in cooperation with the switches SW3 and SW4, switches between allowing the second battery BAT 2 to be charged by the charging circuit 6 driven by the power supply VCC and allowing the second battery BAT 2 to back up the memory 3 for data holding. As shown, the switching block 13 may be constructed, for example, of the switch SW5, serving as switching portion, connected between the connection node 113 and the auxiliary battery power supply voltage node 103 for switching connection/disconnection between the connection node 113 and the auxiliary battery power supply voltage node 103, and a NOR gate circuit 12 as a switching control signal output portion for outputting a signal to the switch SW5 for its switching control, with one input node of the NOR gate circuit 12 receiving the MBOUT signal from the main battery presence sensor block 11, the other input node receiving the inverted signal of VCOM from the voltage comparator 5, and the output node connected to the gate of the switch SW5.

The section enclosed by the two-dot chain line 10A in FIG. 1, including the voltage comparator 5, the reference voltage generator circuit 4, the charging circuit 6, the switching block 13 and the like, may be constructed of a one-chip power-supply control IC for use in the portable-type semiconductor memory device. Furthermore, the main battery presence sensor block 11 may be included in the one-chip power-supply control IC.

The operation of the device 10 is now discussed. In this embodiment, the VCOM signal from the voltage comparator 5 is inverted by the NOT gate circuit 15 before being fed to the NOR gate circuit 12. The switch SW5 of p-channel MOS transistor is turned off when the output of the NOR gate circuit 12 is driven to an H-level with both of the inverted signal of VCOM and the MBOUT signal from the main battery presence sensor block 11 being at an L-level. That is, the switch SW5 is turned off when the voltage level supplied by the power supply VCC drops at the external power supply voltage node 101, for example, with the host apparatus 20 disconnected from the portable-type semiconductor memory device 10 and when the first battery BAT 1 as the main battery is present. Otherwise, the switch SW5 remains turned on. Therefore, when the power supply VCC of the host apparatus 20 feeds power to the internal power supply voltage node 8, both of the switches SW4 and SW5 are turned on regardless of the presence or absence of the first battery SAT 1, and the second battery BAT 2 is charged by the charging circuit 6 driven by the power supply VCC. When the voltage level supplied by the supply VCC drops at the external power supply voltage node 101 and when the first battery BAT 1 is present, both of the switches SW2 and SW3 are turned on, and the switch SW5 is turned off. Thus, only the first battery BAT 1 supplies power through its associated main battery power supply voltage node 102 to the internal power supply voltage node 8. When the voltage level of the power supply VCC drops and when the first battery BAT 1 is absent for replacement or a similar reason, both of the switches SW3 and SW5 are turned on, and power supplying to the internal power supply voltage node 8 is performed through only the auxiliary battery power supply voltage node 103 that connects to the second battery BAT 2.

As described above, the switches SW1, SW2, SW3 and SW4 and the switching block 13 constitute the switching means, wherein said switching means: establishes connection between the external power supply voltage node and the internal power supply voltage node while establishing connection between the charging means and the second battery at the same time, when the external power supply voltage supplied at the external power supply voltage node by the power supply of the host apparatus is higher than the predetermined value. When the external power supply voltage supplied at the external power supply voltage node by the power supply of the host apparatus is lower than the predetermined value, the switching means establishes connection between the first battery voltage node to which the first battery supplies the first battery power supply voltage and the internal power supply voltage node with the first battery being present, and establishes connection between the second battery voltage node to which the second battery supplies the second battery power supply voltage and the internal power supply voltage node with the first battery being absent.

As described above, this embodiment includes the main battery presence sensor block 11 and the switching block 13 so that the second battery BAT 2 is charged by the charging circuit 6 driven by the power supply VCC of the host apparatus 20 regardless of the presence or absence of the first battery BAT 1 when the portable-type semiconductor memory device 10 is connected to the host apparatus 20. When power supplying to the external power supply voltage node 101 from the power supply VCC of the host apparatus 20 is interrupted, if the first battery BAT 1 is not present, power supplying is performed from the auxiliary battery power supply voltage node 103 to the internal power supply voltage node 8 for the memory 3 to hold data. In this case, if the first battery BAT 1 is present, power supplying is performed from only the main battery power supply voltage node 102 that connects to the first battery BAT 1. Unlike the known device, the present embodiment is free from rapid consumption of the first battery BAT 1, which would take place if the first battery BAT 1 were used to charge the second battery BAT 2. This embodiment is also free from such an inconvenience that both of the first battery BAT 1 and the second battery BAT 2 are used for the memory 3 for data holding and the second battery BAT 2 is fully consumed when it is needed most to back up the memory 3 during battery replacement. Consumption of the first battery BAT 1 is lessened, and the life of the first battery BAT 1 is prolonged. Furthermore, power of the second battery BAT 2 assures that the memory 3 holds data during replacement of the first battery BAT 1. Reliability in terms of data holding is thus improved.

The capacity of the second battery BAT 2 as the auxiliary battery is acceptable if it is sufficient to back up the memory 3 for data holding (data backup) during a brief period of time for replacement of the first battery BAT 1 as the main battery. Thus, a small battery may be employed, and a compact design can be implemented. An acceptable small battery suitable for the second battery BAT 2 in the present invention is a capacitor-type PAS (polyacene) battery, which is free from aging in performance and liquid leaks in the known chemical battery. Because of its simple structure, the PAS battery offers excellent reliability. Furthermore, the PAS battery features a short charging time and achieves a high number of charge and discharge cycles, as high as tens of thousands of cycles. Reliability of the device is heightened even further, and an excellent quality portable-type semiconductor memory device results. Thus, if the second battery BAT 2 is of a capacitor-type PAS (polyacence) battery, it requires only extremely infrequent replacement. Since the holder for the secondary battery BAT 2 is unnecessary, the device is produced at simpler manufacturing steps and a lower manufacturing cost.

In this embodiment, the switch SW5 remains continuously turned on if the first battery BAT 1 is not used from the start of operation. The second battery BAT 2 of the secondary type is used as a main battery rather than the auxiliary battery. The device 10 can thus operate in two different modes without modifying its circuitry. Namely, the device 10 may operate in a first mode in which the main battery of the primary type and the auxiliary battery of the secondary type are employed. The device 10 may further operate in a second mode in which only the main battery of the secondary type is employed.

Embodiment 2

Figure 2:
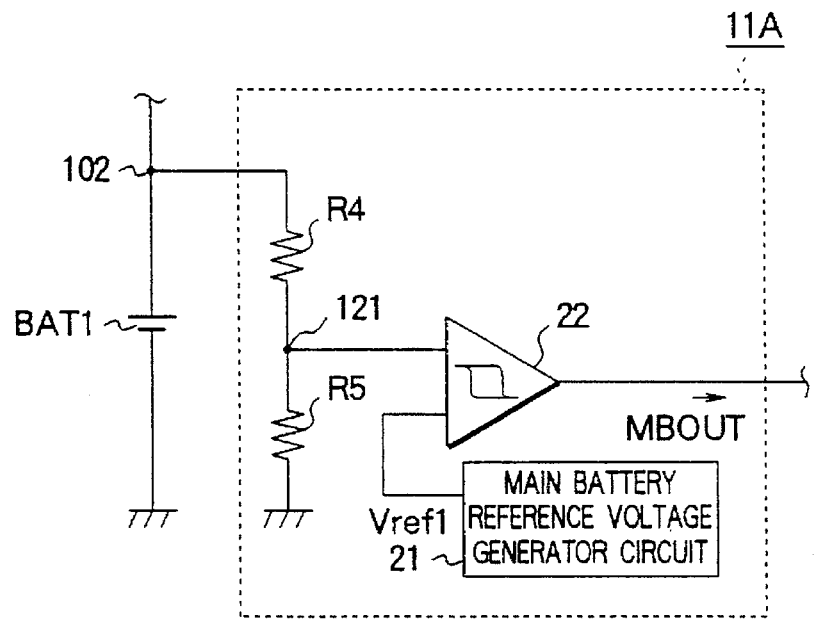
FIG. 2 is a block diagram showing an example of the construction of the main battery presence sensor block in FIG. 1 according to embodiment 2 of the present invention.

Discussed next is a specific construction of an example of the main battery presence sensor block 11 in FIG. 1. The rest of the device remains unchanged from the embodiment 1 in FIG. 1 and its explanation will not be repeated. As shown in FIG. 2, the main battery presence sensor block 11A according to the second embodiment includes a main battery reference voltage generator circuit 21 serving as a reference voltage generator portion for generating a reference voltage Vref1. Two resistors R4 and R5 are connected between the main battery power supply voltage node 102 and the ground node, with the connection node 121 of the resistors R4 and R5 connected to one input node of a later-described main battery voltage comparator 22. The main battery voltage comparator 22 serves as a first battery voltage comparator portion, which has one input node connected to the connection node 121 where the voltage dependent on the voltage supplied at the main battery power supply node 102, namely, the voltage divided by the two resistors R4 and R5, appears. The main battery voltage comparator 22 has another input node supplied with the reference voltage Vref1 outputted by the main battery reference voltage generator circuit 21, in order to compare the voltage level of the first battery BAT 1 with the reference voltage Vref1 so as to output a signal MBOUT indicative of the comparison result. The main-battery presence signal MBOUT is at an L-level when the voltage at the connection node 121, namely the voltage level divided by resistors R4 and R5, is higher than the reference voltage Vref1 and the main-battery presence MBOUT is at a H-level when the voltage at the connection node 121 is lower than the reference voltage Vref1. Hysteresis is imparted to the main-battery voltage comparator 22 so that power supplied to the memory 3 may not be interrupted in the course of switching between the first battery BAT 1 and the second battery BAT 2.

The second embodiment offers the same advantage as the embodiment 1. Furthermore, the main battery presence sensor block 11A outputs the main battery presence signal MBOUT by comparing the voltage level of the first battery BAT 1 as the main battery with the reference voltage Vref1. Thus, the absence of the first battery BAT 1 is immediately sensed, and the power source feeding to the internal power supply voltage node 8 is immediately switched to the second battery BAT 2, so that the memory 3 holds data continuously.

Embodiment 3

Figure 3:
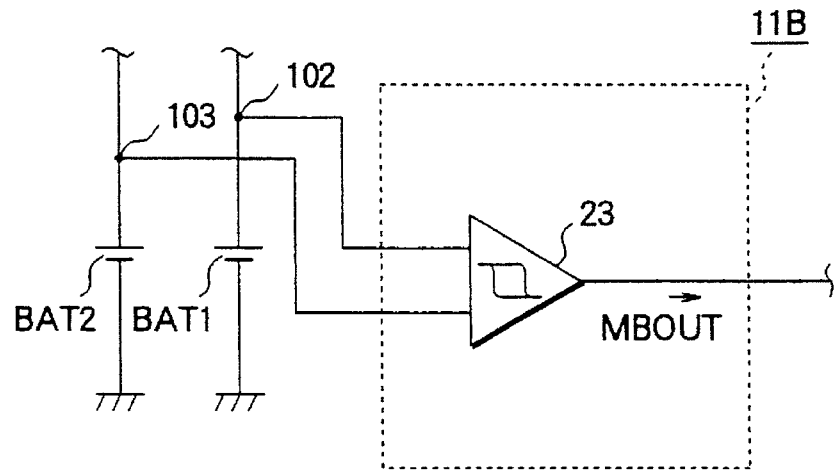
FIG. 3 is a block diagram showing another example the construction of the main battery presence sensor block in FIG. 1 according to embodiment 3 of the present invention.

Discussed next is the construction of another example of the main battery presence sensor block 11 in FIG. 1. As shown in FIG. 3, the main battery presence sensor block 11B according to the third embodiment is constructed of a battery voltage comparator 23 serving as a battery voltage comparator portion, which has one input node connected to the main battery power supply voltage node 102 that connects to the first battery BAT 1, and the other input node connected to the auxiliary power supply voltage node 103 that connects to the second battery BAT 2, in order to compare the voltage level at the main battery power supply voltage node 102 with the voltage level at the auxiliary battery power supply voltage node 103. The battery voltage comparator 23 outputs a main battery presence signal MBOUT indicative of the comparison result. The main-battery presence signal MBOUT is at an L-level when the voltage level of the first battery BAT 1 is higher than the voltage level of the second battery BAT 2 (that is, when, the first battery BAT 1 is present), and the main-battery presence MBOUT is at an H-level when the voltage level of the first battery BAT 1 is lower than the voltage level of the second battery BAT 2. Hysteresis is imparted to the main-battery voltage comparator 23 so that power supplied to the memory 3 is not interrupted in the course of switching between the first battery BAT 1 and the second battery BAT 2.

The third embodiment offers the same advantage as the embodiment 1. The purpose of the use of the main and auxiliary batteries is to assure that the memory 3 is continuously powered so as not to lose data. When the voltage level at the main battery power supply voltage node 102 that connects to the first battery BAT 1 as the main battery drops below the voltage level at the auxiliary battery power supply voltage node 103 that connects to the second battery BAT 2 as the auxiliary battery, the second battery BAT 2 more effectively supplies power to the internal power supply voltage node 8 for the memory 3 to hold data. As already described, in this embodiment, the voltage levels of the main battery power supply voltage node 102 and auxiliary battery power supply voltage node 103 are compared, and power is supplied to the internal power supply voltage node 8 by a higher voltage level battery. Data holding by the memory 3 is thus performed efficiently and in a reliable manner. Since the construction of the circuitry is simplified, the device may be manufactured easily and economically.

Embodiment 4

Figure 4:
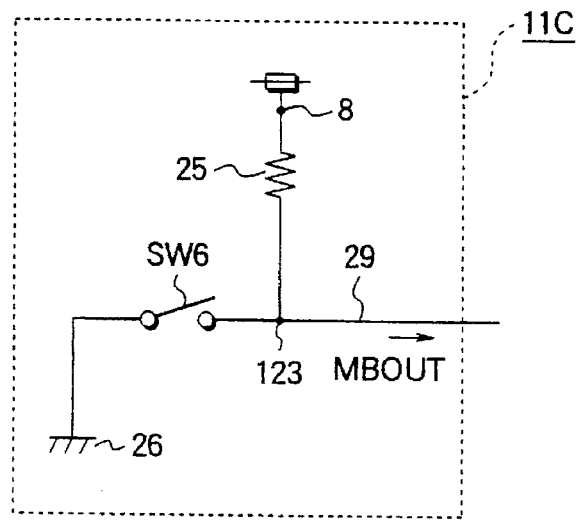
FIG. 4 is a block diagram showing still another example of the construction of the main battery presence sensor block in FIG. 1 according to embodiment 4 of the present invention.

Discussed next is the construction of yet another example of the main battery presence sensor block 1 in FIG. 1. As shown in FIG. 4, the main battery presence sensor block 11C comprises a ground node 26, a signal line 29 connected to the switching block 13, a pull-up resistor 25 connected between the signal line 29 and the internal power supply voltage node 8, a switch SW6 connected between the connection node 123 of the signal line 29 and the pull-up resistor 25 and the ground node 26 for switching the connection/disconnection between the pull-up resistor 25 and the ground node 26, and the output signal line 29 connected to the connection node 123. As described later, the switch SW6 is turned off when the first battery BAT 1 is not present in the portable-type semiconductor memory device 10, and is turned on when the first battery BAT 1 is present.

Figure 5:
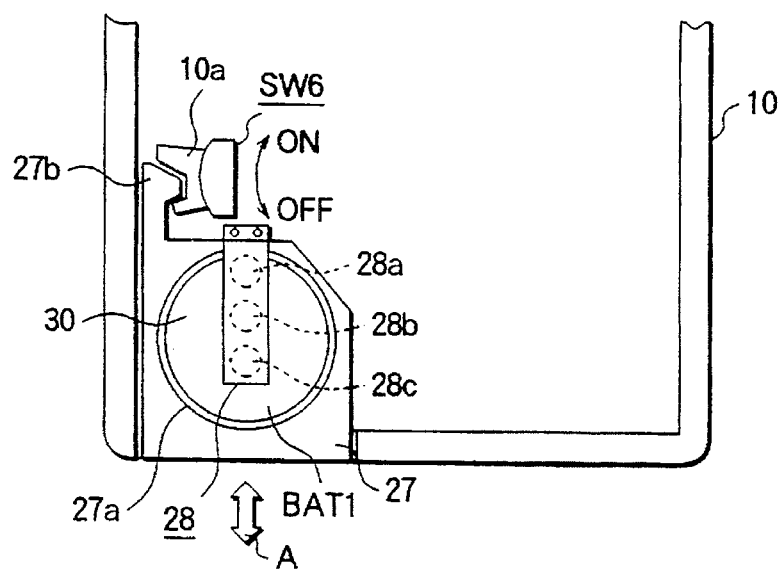
FIG. 5 is a block diagram showing the mechanical construction of the main battery presence sensor block in FIG. 1 according to embodiment 4 of the present invention.

When the first battery BAT 1 is not present in the portable-type semiconductor memory device 10, the switch SW6 is turned off, and a main battery presence signal MBOUT is output to the switching block 13 via the signal line 29 and is maintained at an H-level by means of the pull-up resistor 25. When a first battery BAT 1 is put into position in the portable-type semiconductor memory device 10, the switch SW6 is turned on, driving the main battery presence signal MBOUT to an L-level. As illustrated in FIG. 5, the switch SW6 may be a mechanical switch. When the battery holder 27 is inserted, the switch SW 6 may be mechanically automatically closed. The switch SW6 constitutes connection means for electrically connecting the signal line 29 to the ground node 26.

As shown in FIG. 5, the portable-type semiconductor memory device 10 is provided with the battery holder 27 that can be pulled out in the direction of the arrow A. The battery holder 27 comprises a battery mount 27a that has a slight recess that receives the first battery BAT 1, and the first battery BAT 1 is seated there and fixed. The battery mount 27a has a complementary shape to the first battery BAT 1. To replace the first battery BAT 1, the battery holder 27 is pulled out in the direction of the arrow A, the existing first battery BAT 1 in the battery mount 27a is replaced with a new one, the battery holder 27, in which the new battery is mounted, is inserted in the direction of the arrow A and is set in position. In this embodiment, the switch SW6 as shown in FIG. 5 is constructed of a key-like male switch contact 27b attached to the battery holder 27 and a female switch contact 10a disposed in the portable-type semiconductor memory device 10, and the male switch contact 27b is mated with the female switch contact 10a. When the battery holder 27 is inserted or removed, the switch SW6 is mechanically turned on or off. Namely, when the battery holder 27 is pulled out, the switch SW6 is turned off, and when the battery holder 27 is inserted, the switch SW 6 is turned on.

Figure 6:
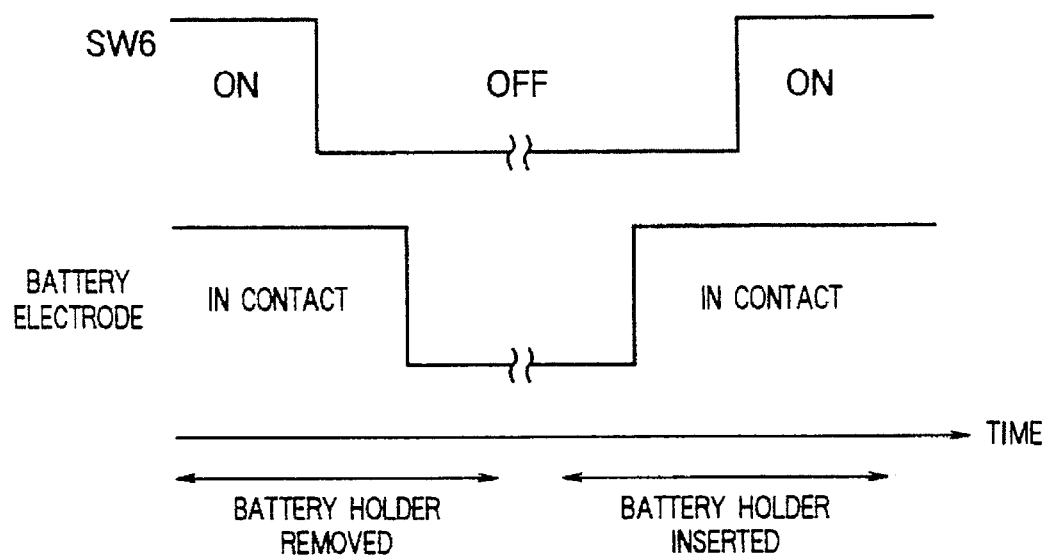
FIG. 6 is a timing chart of the embodiment 4.

The portable-type semiconductor memory device 10 of the fourth embodiment includes battery connection means constructed of a device-side contact 28 for electrically connecting a battery electrode 30 that is extensive over the surface of the first battery BAT 1 to the internal power supply voltage node 102. The contact 28 is supported and projected across the battery holder 27 in the direction of the arrow A in a cantilever fashion, and is connected to the battery electrode 30 when the battery holder 27 is inserted into the device. Switch SW5 in FIG. 1 is turned on in succession to the shifting of the main battery presence signal MBOUT from L-level to H-level after the switch SW 6 is turned on. The battery electrode 30 of the first battery BAT 1 should remain in contact with the device-side contact 28 at least until the switch SW5 is turned on, considering that the memory 3 must hold data when the portable-type semiconductor memory device 10 is disconnected from the host apparatus 20 and that the power source for driving the NOR gate circuit 12 for controlling the switch SW5 is the first battery BAT 1. As the timing chart in FIG. 6 shows, the switching of the switch SW6 and the contact/non-contact between the battery electrode 30 of the first battery BAT 1 and the device-side contact 28 are different in timing by predetermined durations therebetween. To this end, the battery electrode 30 of the first battery BAT 1 is designed to be surface-wide and the device-side contact 28 is provided with a plurality of conductive projections 28a, 28b, and 28c, as contact points to be electrically connected to the battery electrode 30, arranged in the direction of the arrow A.

In the structure described above, in the course of the pulling out the battery holder 27, when the battery holder 27 is pulled slightly, the switch SW6 is mechanically turned off. The battery electrode 30 remains electrically connected to at least projections 28b and 28c arranged far outward, among the projections 28a, 28b and 28c (refer to FIG. 6), and power is continuously supplied to the memory 3. With the battery holder 27 pulled further out, projections 28b and then 28c are electrically disconnected in sequence from the battery electrode 30. Finally, all projections 28a, 28b and 28c are detached from the battery electrode 30.

On the other hand, when the battery holder 27 is inserted shallowly, the battery electrode 30 is electrically connected to projection 28c of the device-side contact 28. In this state, however, the switch SW6 remains off (refer to FIG. 6). The battery holder 27 is continuously inserted. When the battery holder 27 is fully inserted, the male switch contact 27b of the battery holder 27 is engaged with the female switch contact 10a of the portable-type semiconductor memory device 10, causing the switch SW6 to turn on.

As described above, according to this embodiment, the use of the pull-up resistor 25 causes the L-level main battery presence signal MBOUT to be automatically generated when the first battery BAT 1 is inserted. This arrangement simplifies the construction of the main battery presence sensor block 11C, and still achieves the advantages of the first embodiment.

Since the device-side contact 28 is provided with the plurality of projections 28a, 28b, and 28c which are put into electrical contact with the battery electrode 30, the switching of the switch SW6 takes place in different timings with predetermined durations with respect to the connect/disconnect between the battery electrode 30 of the first battery BAT 1 and the device-side contact 28 as shown in the timing chart in FIG. 6. Thus, power is not interrupted when the power source for feeding the internal power supply voltage node 8 for the memory 3 to hold data is switched from the first battery BAT 1 to the second battery BAT 2. Power supplied to the internal power supply voltage node 8 is reliably and continuously performed. A high reliability in the data holding of the memory 3 is thus achieved.

Embodiment 5

Figure 7:
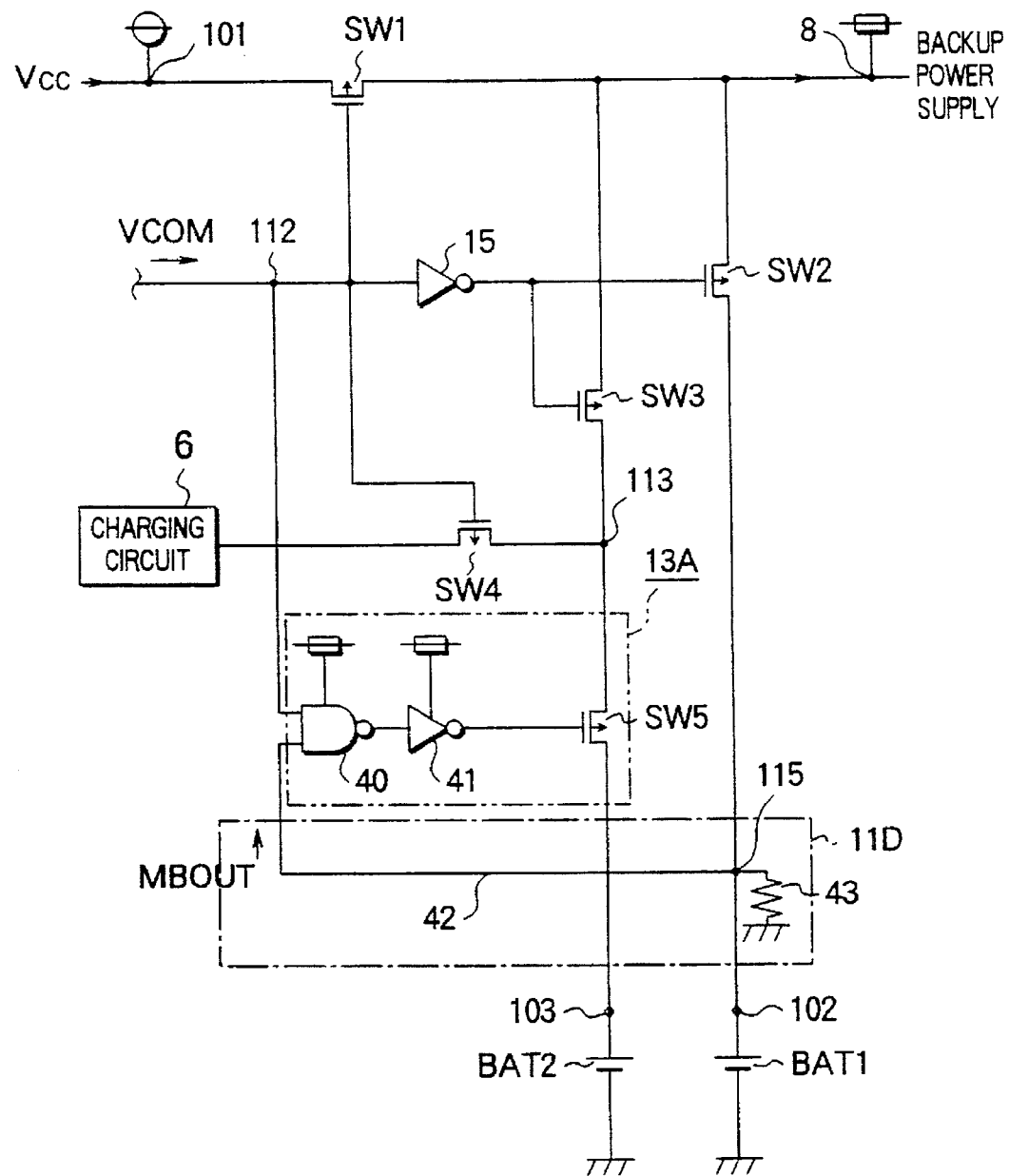
FIG. 7 is a block diagram showing partially the construction of the portable-type semiconductor memory device according to embodiment 5 of the present invention.
Figure 8:
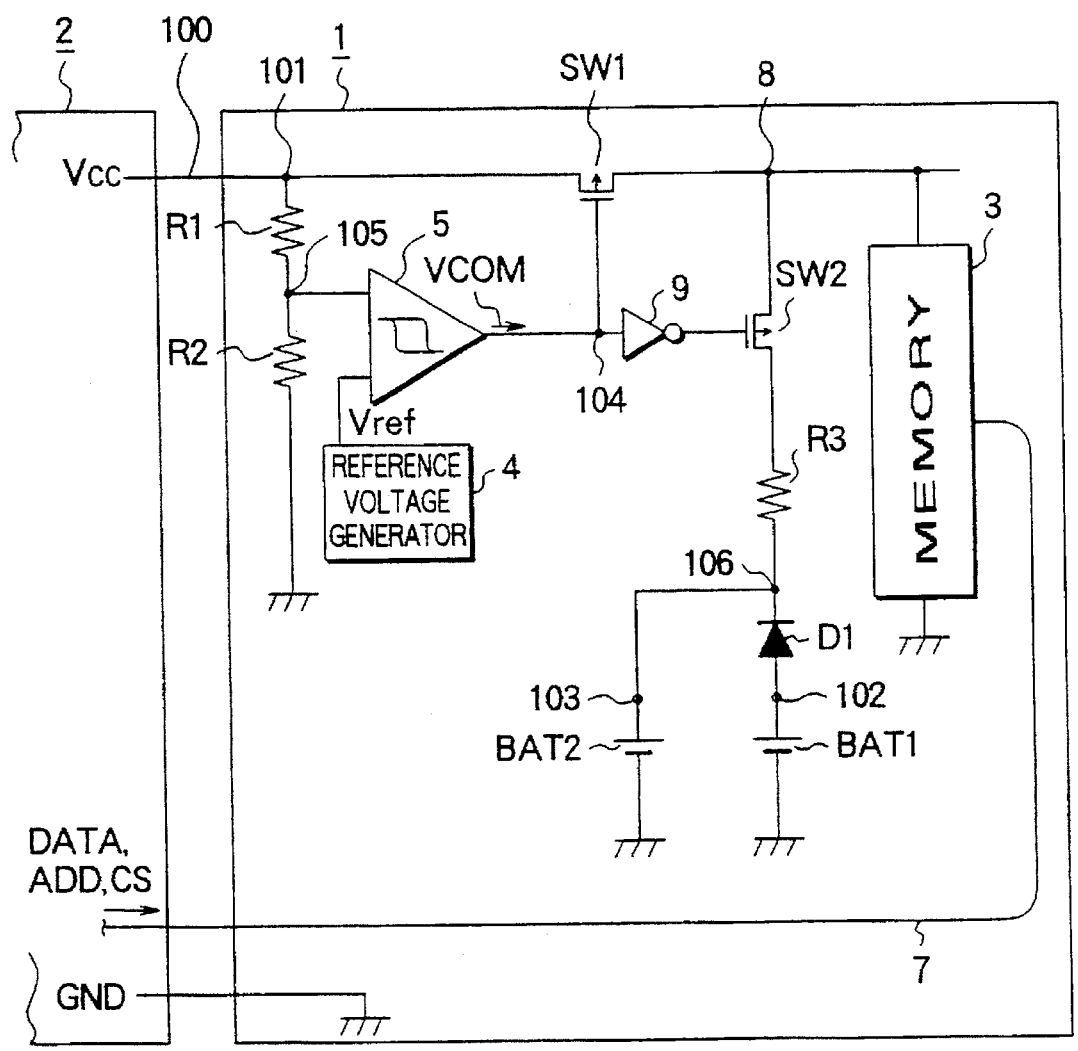
FIG. 8 is the block diagram showing the construction of a privately known portable-type semiconductor memory device.

Discussed next is the construction of yet another example of the main battery presence sensor block 11 in FIG. 1. FIG. 7 is a fragmented block diagram of the construction of the fifth embodiment. In this embodiment, part of the construction which FIG. 7 does not show is identical to that of FIG. 1, and its explanation will not be repeated. The main battery presence sensor block 11D according the fifth embodiment includes a signal line 42 connected between the main battery power supply voltage node 102 connected to the first battery BAT 1 and the input node of the switching block 13A, and a pull-down resistor 43 connected between a ground node and the connection node 115 of the signal line 42 and the main battery power supply voltage node 102. Therefore, the voltage level at the main battery power supply voltage node 102 that connects to the first battery BAT 1, is used as the main battery presence signal MBOUT. In this case, when the first battery BAT 1 is present, the main battery presence signal MBOUT is at an H-level. This level setting fails to agree with that of the first embodiment. For this reason, as shown, the switching block 13A in the first embodiment employs NAND gate circuit 40 and NOT gate circuit 41 instead of the NOR gate circuit 12 in FIG. 1.

In this embodiment constructed as above, in the same way as in the first embodiment, the switch SW5 is turned on when power is supplied to the external power supply voltage node 101 from the power supply VCC of the host apparatus 20. Thus, the second battery BAT 2 is charged by the charging circuit 6 driven by the power supply VCC and the first battery BAT 1 is prevented from being consumed as the charging power supply for the second battery BAT 2. When the voltage at the external power supply voltage node 101 fed by the power supply VCC of the host apparatus 20 drops, the switch SW5 is turned off with the first battery BAT 1 present, and only the first battery BAT 1 serves as a power source that feeds power to the internal power supply voltage node 8 for the memory 3 to hold data. Thus, power of the second battery BAT 2 is not consumed. When the first battery BAT 1 is not present, the switch SW5 is immediately turned on, and the second battery BAT 2 feeds power to the internal power supply voltage node 8 for the memory 3 to hold data.

This embodiment offers the same advantage as the first embodiment. The construction of this embodiment is simple enough to be implemented from a power controlling portion thereof into an IC. As a result, the portable-type semiconductor memory device 10 can be constructed of a smaller number of components, and the cost for components is substantially reduced.

What is claimed is:

1. A semiconductor memory device comprising:
   an external power supply voltage node to which an external power supply voltage is supplied;
   an internal power supply voltage node for transmitting an internal power supply voltage;
   a volatile semiconductor memory coupled to said internal power supply voltage;
   a first battery having a capacity sufficient to drive said semiconductor memory to retain data for a long period of time;
   a second battery electrically connected to said internal power supply voltage node for driving said memory to retain data;
   charging means driven by the external power supply voltage for charging said second battery;
   a first battery voltage node to which a first battery power supply voltage is supplied by said first battery;
   a second battery voltage node to which a second battery power supply voltage is supplied by said second battery;
   external power supply voltage detector means for detecting said external power supply voltage at said external power supply voltage node and for generating a signal indicative of the external power supply voltage;
   first battery presence sensor means for sensing a presence/absence of said first battery and generating an output signal; and
   switching means responsive to the signal generated by said external power supply voltage detector means and the output signal from said first battery presence sensor means, for
   (a) connecting said external power supply voltage node to said internal power supply voltage node while connecting said charging means to said second battery when said external power supply voltage supplied at said external power supply voltage node is higher than a predetermined value; and
   (b) for connecting said first battery voltage node to said internal power supply voltage node or connecting said second battery voltage node to said internal power supply voltage node when the external power supply voltage is lower than the predetermined value.

2. The semiconductor memory device according to claim 1, wherein said switching means comprises:
   a first switching circuit for interconnecting said external power supply voltage node and said internal power supply voltage node responsive to the signal from said external power supply voltage detector means when said external power supply voltage is higher than the predetermined value;
   a second switching circuit for interconnecting said first battery voltage node and said internal power supply voltage node responsive to the signal from said external power supply voltage detector means when said external power supply voltage is lower than the predetermined value;

a third switching circuit for interconnecting said second battery voltage node and said internal power supply voltage node responsive to the signal from said external power supply voltage detector means when said external power supply voltage is lower than the predetermined value;

a fourth switching circuit for interconnecting said charging means and said second battery responsive to the signal from said external power supply voltage detector means when said external power supply voltage is higher than the predetermined value; and a switching circuit for disconnecting said second battery voltage node from said third switching circuit, and simultaneously disconnecting said second battery voltage node from said fourth switching circuit, responsive to the signal from said external power supply voltage detector means and the output signal from said first battery presence sensor means, when said external power supply voltage is lower than the predetermined value.

3. The semiconductor memory device according to claim 1, wherein said first battery presence sensor means comprises:

a reference voltage generator circuit for generating a reference voltage; and a first battery voltage comparator circuit having one input node to which the first battery power supply voltage is input and another input node to which the reference voltage is input, said first battery voltage comparator comparing the first battery power supply voltage with the reference voltage and outputting a comparison result signal to said switching means.

4. The semiconductor memory device according to claim 1, wherein said first battery presence sensor means comprises:

a battery voltage comparator circuit having one input node to which the first battery power supply voltage is input and another input node to which the second battery power supply voltage is input, said battery voltage comparator circuit comparing the first battery power supply voltage with the second battery power supply voltage and outputting a comparison result signal to said switching means.

5. The semiconductor memory device according to claim 1, wherein said first battery presence sensor means comprises:

a ground node;

a signal line connected to said switching means;

a pull-up resistor connected between said internal power supply voltage node and said signal line; and connection means for connecting said signal line to said ground node.

6. The semiconductor memory device according to claim 5 further comprising:

a main body; and a battery holder which is detachably inserted into said main body for mounting said first battery thereon;

wherein said connection means includes a mechanical switch disposed between said main body and said battery holder, the switch being automatically and mechanically engaged when said battery holder is inserted into said main body to electrically connect said signal line to said ground node.

7. The semiconductor memory device according to claim 6 further comprising:

battery connection means for electrically connecting said first battery to said first battery voltage node when said battery holder is inserted into said main body;

said battery connection means being disposed in a direction of insertion of said battery holder for electrically connecting said battery electrode to said first battery voltage node when the insertion of said battery holder starts; and said connection means being mechanically engaged when said battery holder is fully inserted into said main body.

8. The semiconductor memory device according to claim 1, wherein said first battery presence sensor means comprises:

a ground node;

a signal line connected between said switching means and said first battery voltage node at a connection node; and a pull-down resistor connected between said ground node and the connection node of said signal line and said first battery voltage node.

9. A one-chip power supply control IC for use in a semiconductor memory device comprising:

a volatile semiconductor memory;

a first battery having a capacity sufficient to drive said semiconductor memory to retain data for a long period of time;

a second battery for driving said memory to retain data;

a first battery voltage node to which said first battery supplies a first battery power supply voltage;

a second battery voltage node to which said second battery supplies a second battery power supply voltage;

an external power supply voltage node to which external power supply voltage is supplied;

an internal power supply voltage node for supplying internal power supply voltage;

first battery presence sensor means for sensing a presence or absence of said first battery and generating an output signal indicative of the presence or absence of said first battery;

charging means driven by the external power supply voltage for charging said second battery;

external power supply voltage detector means for detecting the external power supply voltage at said external power supply voltage node and for generating a signal indicative of the external power supply; and switching means, responsive to the signal from said external power supply voltage detector means and the output signal from said first battery presence sensor means, for (a) connecting said external power supply voltage node to said internal power supply voltage node while connecting said charging means to said second battery when said external power supply voltage supplied at said external power supply voltage node is higher than a predetermined value; and (b) for connecting said first battery voltage node to said internal power supply voltage node or connecting said second battery voltage node to said internal power supply voltage node when the external power supply voltage is lower than the predetermined value.

10. A one-chip power supply control IC for use in a semiconductor memory device comprising:

a volatile semiconductor memory;

a first battery having a capacity sufficient to drive said semiconductor memory to retain data for a long period of time;

a second battery for driving said memory to retain data;

a first battery voltage node to which said first battery supplies a first battery power supply voltage;

a second battery voltage node to which said second battery supplies a second battery power supply voltage;

an external power supply voltage node to which external power supply voltage is supplied;

an internal power supply voltage node for supplying internal power supply voltage;

first battery presence sensor means for sensing a presence or absence of said first battery and generating an output signal indicative of the presence or absence of said first battery;

charging means driven by the external power supply voltage for charging said second battery;

external power supply voltage detector means for detecting the external power supply voltage at said external power supply voltage node and for generating a signal indicative of the external power supply; and switching means, responsive to the signal from said external power supply voltage detector means and the output signal from said first battery presence sensor means, for (a) connecting said external power supply voltage node to said internal power supply voltage node while connecting said charging means to said second battery when said external power supply voltage supplied at said external power supply voltage node is higher than a predetermined value; and (b) when the external power supply voltage is lower than the predetermined value, for connecting said first battery voltage node to said internal power supply voltage node responsive to the output signal of said first battery presence sensor means indicative of the presence of said first battery and for connecting said second battery voltage node to said internal power supply voltage node responsive to the output signal of said first battery presence sensor means indicative of the absence of said first battery.

* * * * *